United States Patent [19]
Uchida

[11] Patent Number: 6,111,799
[45] Date of Patent: Aug. 29, 2000

[54] SEMICONDUCTOR MEMORY IN WHICH ACCESS TO BROKEN WORD LINE IS INHIBITED

[75] Inventor: Shouzou Uchida, Tokyo, Japan

[73] Assignee: NEC Corporation, Tokyo, Japan

[21] Appl. No.: 09/408,180

[22] Filed: Sep. 29, 1999

[30] Foreign Application Priority Data

Oct. 29, 1998 [JP] Japan ................................. 10-309128

[51] Int. Cl.⁷ ...................................................... G11C 7/00
[52] U.S. Cl. ...................................... 365/200; 365/230.06
[58] Field of Search .............................. 365/230.06, 200, 365/203, 201, 154; 713/1

[56] References Cited

U.S. PATENT DOCUMENTS

| | | | |
|---|---|---|---|
| 4,429,388 | 1/1984 | Fukushima et al. | ..................... 365/201 |
| 4,905,194 | 2/1990 | Ohtsuka et al. | ......................... 365/200 |
| 5,005,068 | 4/1991 | Ikeda et al. | ............................... 365/154 |
| 5,483,490 | 1/1996 | Iwai et al. | ................................ 365/200 |
| 5,983,346 | 11/1999 | Wendell | ....................................... 713/1 |

FOREIGN PATENT DOCUMENTS

6-13578  1/1994  Japan .

*Primary Examiner*—Trong Q. Phan
*Attorney, Agent, or Firm*—Sughrue, Mion, Zinn, Macpeak & Seas, PLLC

[57] ABSTRACT

A semiconductor memory is provided with a memory cell, a driver circuit driving the memory cell, a first word line and a second word line. The first word line is connected to the driver circuit and transmits a first potential and a second potential outputted by the driver circuit to the memory cell. The second word line is connected to the driver circuit and transmits the first potential and the second potential to the memory cell. The second word line has a resistance higher than that of the first word line. In this way, even if a word line is broken, a multiple selection phenomenon is not incurred.

19 Claims, 7 Drawing Sheets

SEMICONDUCTOR MEMORY IN WHICH ACCESS TO BROKEN WORD LINE IS INHIBITED

BACKGROUND OF THE INVENTION

1. Field of the Invention

The present invention relates to a semiconductor memory in which access to a broken word line is inhibited.

2. Description of the Related Art

A semiconductor memory has a group of memory cells arranged in a matrix. The memory cells in a row direction are referred to as a memory cell array. A semiconductor memory with a large capacity has a large number of memory cell arrays. The increase of the number of memory cell arrays causes an area occupied by the memory cell group to be increased. A word line and a bit line are connected to the memory cell. The word line and the bit line are used for activation of the memory cell. A signal transmission speed is slow in the word line and the bit line which have a large resistance. The reduction of the resistance of the word line and the bit line enables an operational speed of the semiconductor memory to be improved. Such a semiconductor memory is described in Japanese Laid Open Patent Application (JP-A-Heisei 06-13578).

The semiconductor memory is manufactured by using a silicon gate MOS process. The memory cell of a semiconductor memory has a MOS transistor. A gate electrode of the MOS-type transistor is made of polysilicon. A word line drive signal is sent through a polysilicon wiring to the MOS transistor. The polysilicon wiring has a resistance which is higher than a resistance of aluminum wiring. A resistivity of the polysilicon is equal to six times a resistivity of aluminum. If the word line is formed by using only the polysilicon, the resistance of the word line is made higher. The utilization of a word suspension structure causes the resistance of the word line (sub-word line) to be reduced. The word suspension structure reduces the resistance of the sub-word line by using aluminum. In the structure, two sub-word lines are prepared for one main word line. In the silicon gate MOS-type semiconductor memory, one sub-word line is formed in a conductive polysilicon (polycrystalline silicon) wiring layer. The other sub-word line is formed in an aluminum wiring layer. The two sub-word lines are connected. A total resistance of the two sub-word lines is lower than a resistance of one sub-word line, due to an influence of the connection.

Figure 1A:
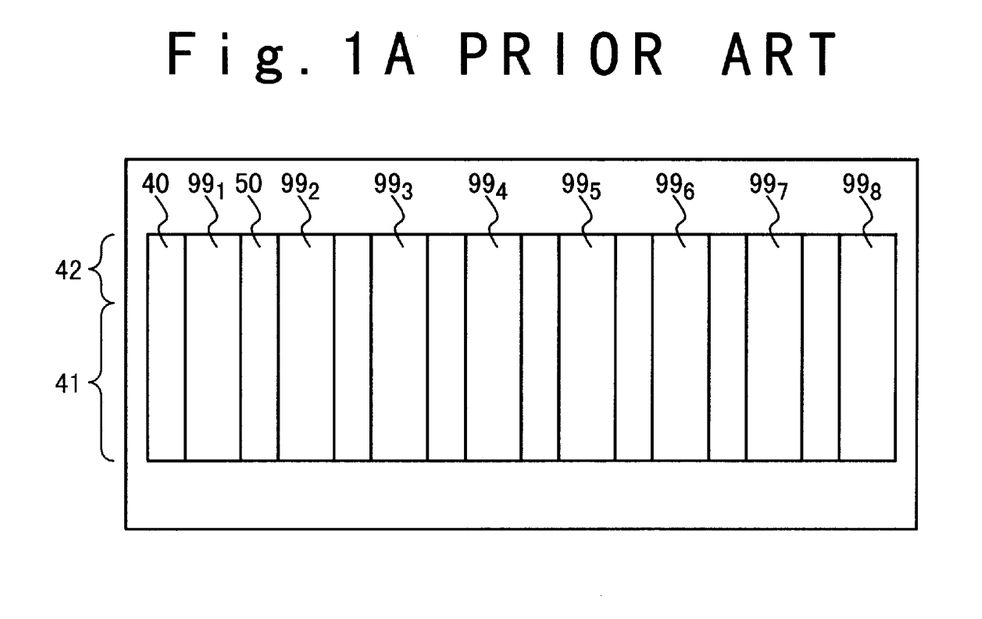
FIGS. 1A and 1B show a configuration of a memory cell array of a conventional semiconductor memory.
Figure 1B:
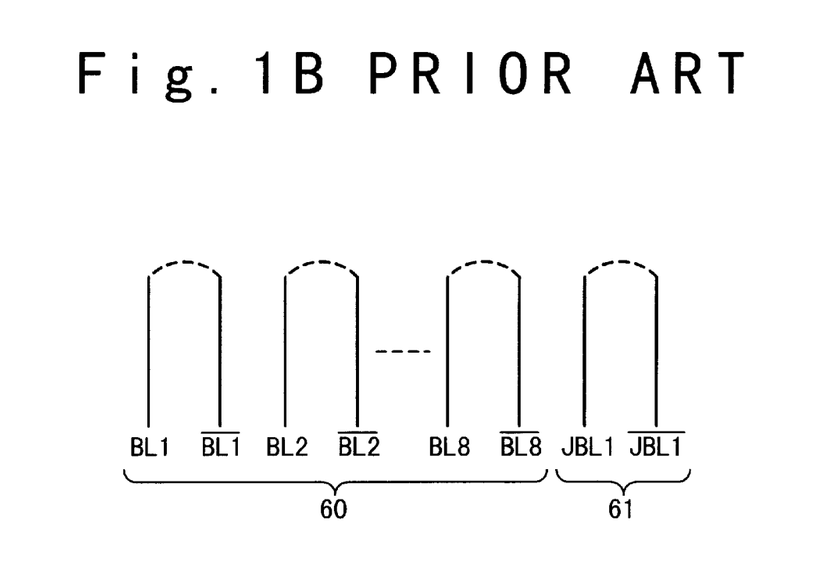

FIGS. 1A and 1B show a configuration of a memory cell array of a conventional semiconductor memory. The memory cell array shown in FIG. 1A is provided in SRAM (Static Random Access Memory). The memory cell array shown in FIG. 1A has 8 cell array blocks $99_1$ to $99_8$. Its memory cell array has a main row decoder 40. Its memory cell array has 7 sub row decoders 50.

The cell array block $99_1$ has a normal column 60 and a redundant column 61, as shown in FIG. 1B. The normal column 60 has 8 memory cells. The normal column 60 has 8 sets of bit lines BL1:_BL1, BL2:_BL2, ... BL8:_BL8. The symbol _ indicates an upper bar in the drawing. The redundant column 61 has one memory cell. The redundant column 61 has one set of a bit line JBL1:_JBL1. The cell array blocks $99_2$ to $99_8$ have the same structure as the cell array block $99_1$.

The memory cell of the redundant column 61 is used if a trouble is induced in the memory cells of the normal column 60. The main row decoder 40 decodes a signal of setting the main word line active. The sub row decoder 50 decodes a signal of setting the sub-word line active. The determination of the main word line to be set active also enables the determination of the sub-word line to be set active.

Figure 2:
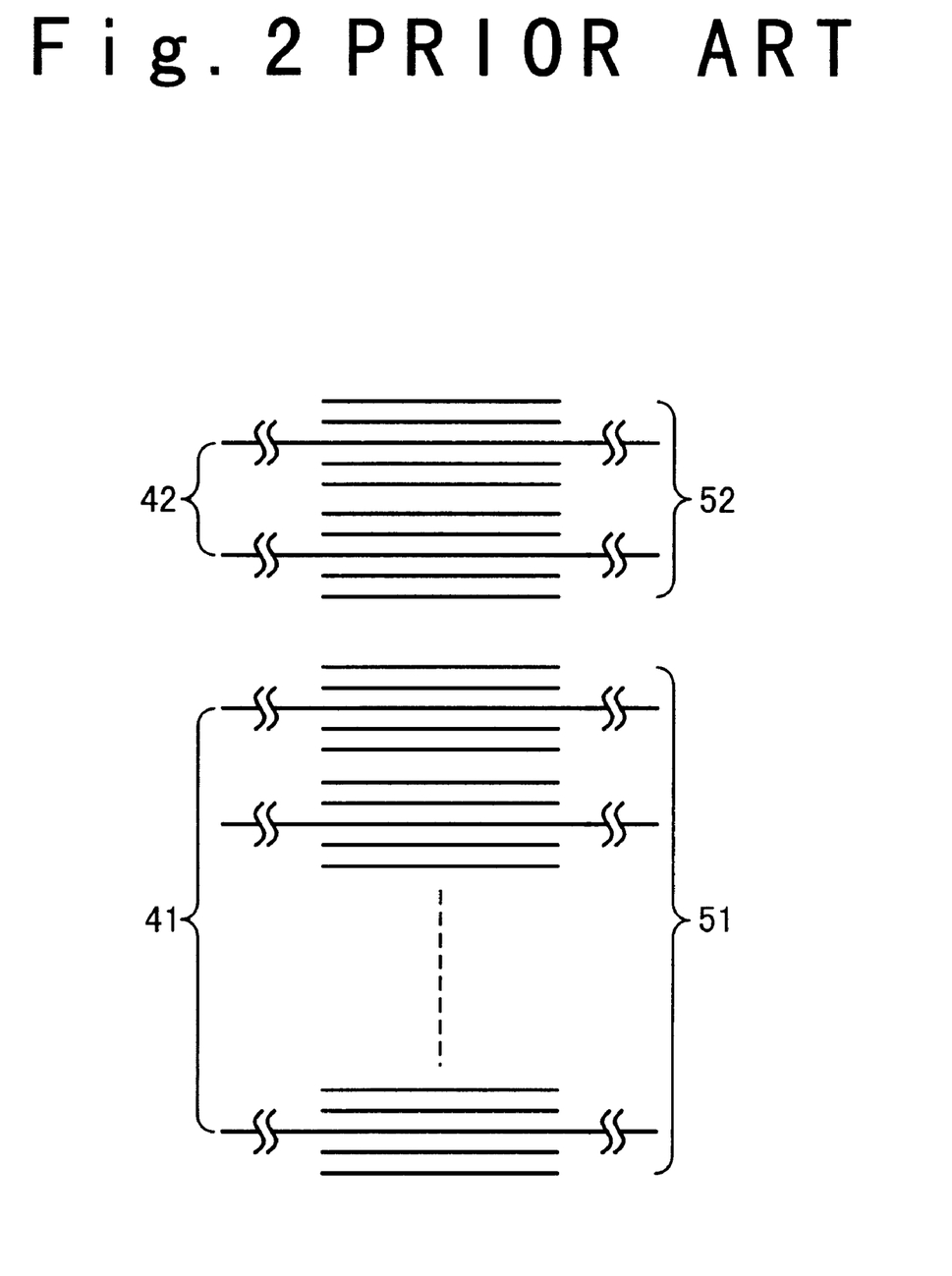
FIG. 2 shows a configuration of a word line of a memory cell array shown in FIGS. 1A and 1B.

FIG. 2 shows a configuration of the word line of the memory cell array shown in FIG. 1. The memory cell array shown in FIG. 1 has a normal word line group 41. Its memory cell array has a normal sub-word line group 51. Its memory cell array has a redundant main word line group 42. Its memory cell array has a redundant sub-word line group 52. The normal main word line group 41 has 256 normal main word lines. The normal sub-word line group 51 has 1024 normal sub-word lines. The redundant main word line group 42 has two redundant main word lines. The redundant sub-word line group 52 has 8 redundant sub-word lines.

Each normal word line is shared by the cell array blocks $99_1$ to $99_8$. Each normal word line is coupled to all of the cell array blocks $99_1$ to $99_8$. Each normal sub-word line is shared by the normal column 60 and the redundant column 61 in each cell array block. Each normal sub-word line is coupled to all of the memory cells in the normal column 60 and the redundant column 61, for each cell array block. Four normal sub-word lines are connected to one normal main word line 41. Four redundant sub-word lines are connected to one redundant main word line.

The normal main word line and the normal sub-word line set the normal memory cell active. The redundant main word line and the redundant sub-word line set the redundant memory cell active.

The activation of one normal main word line in the normal main word line group 41 enables the four normal sub-word line belonging to the normal main word line to be set active.

Figure 3:
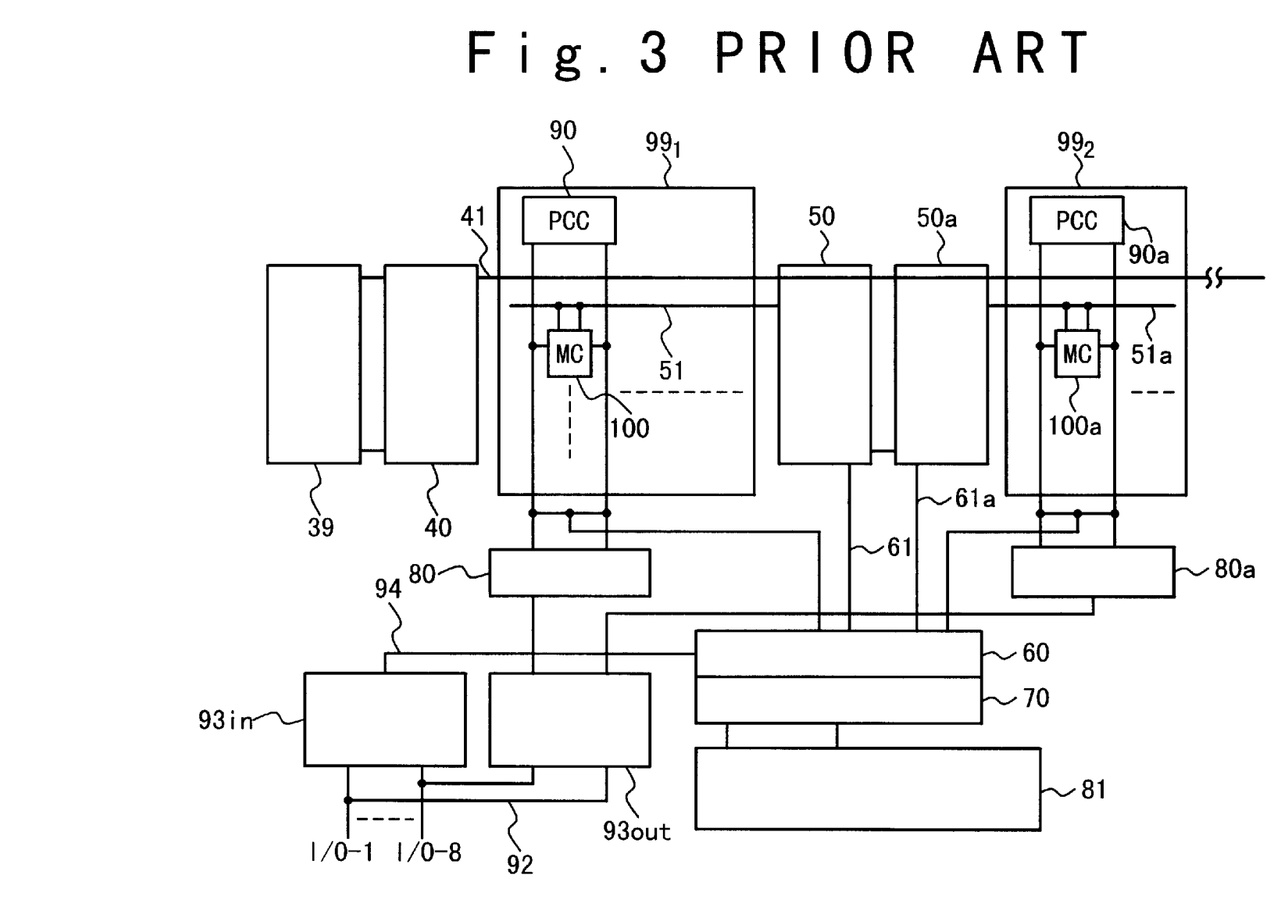
FIG. 3 shows a configuration of a conventional semiconductor memory.

FIG. 3 shows the configuration of the conventional semiconductor memory. FIG. 3 shows the detailed configuration of the semiconductor memory shown in FIGS. 1 and 2. The semiconductor memory shown in FIG. 3 is provided with an address buffer 39, a main row decoder 40, a cell array block $99_1$, a sub row decoder 50, a sense amplifier 80, an address buffer 81, a block selection decoder 60, a column selection decoder 70, an input controller 93*in* and an output controller 93*out*. The semiconductor memory is provided with a sub row decoder 50a, a cell array block $99_2$ and a sense amplifier 80a.

Memory cells 100, 100a are connected through the sense amplifier 80, the input controller 93*in* and the output controller 93*out* to a read bus 92 and a write bus 94.

The cell array block $99_1$ has a pre-charge circuit 90 and the memory cell 100. The cell array block $99_2$ has a pre-charge circuit 90a and the memory cell 100a. The pre-charge circuit 90 is a circuit for pre-charging the bit line. The main row decoder 40 receives a main row address signal through the address buffer 39. The main row decoder 40 sets one main word line active, on the basis of the main row address signal. The sub row decoder 50 activates one of the four sub-word lines belonging to the main word line set active.

The block selection decoder 60 is shared by 8 cell array blocks. The block selection decoder 60 receives a block selection address signal and a sub row address signal through an address buffer 83. The block selection decoder 60 generates a block selection address from the block selection address signal. The block selection decoder 60 generates a sub row address from the sub row address signal. The block selection decoder 60 sets the cell array block active, on the basis of the block selection address. The block selection decoder 60 outputs the sub row address through a sub address signal line 61 to the sub row decoder 50. The sub row decoder 50 selects the sub-word line on the basis of the sub row address.

The block selection decoder 60 receives a redundancy selection signal (sub column address signal) through the address buffer 83. The redundancy selection signal is referred to when the redundant memory cell is set active.

The column selection decoder 70 receives a column address signal through the address buffer 83. The column selection decoder 70 receives a block selection address through the block selection decoder 60. The column selection decoder 70 sets the cell array block active, on the basis of the block selection address. The column selection decoder 70 generates a column address from the column address signal. The column selection decoder 70 sets 8 memory cells in a normal column active, on the basis of the column address. The block selection decoder 60 sets the redundant memory cell active, if a trouble is induced in the normal memory cell.

Figure 4:
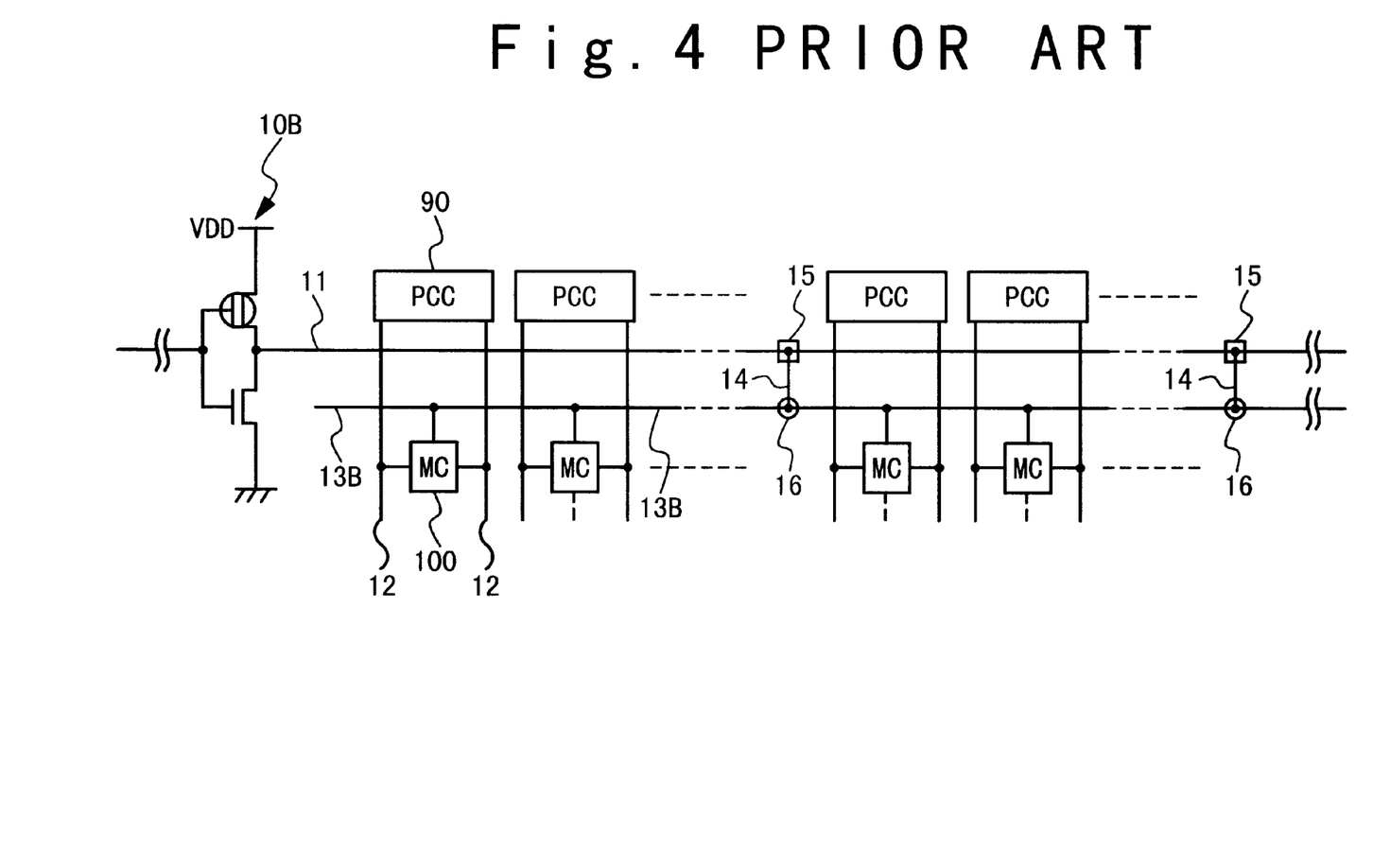
FIG. 4 shows a configuration of a conventional word suspension structure.

FIG. 4 shows a conventional word suspension structure. A semiconductor memory shown in FIG. 4 is provided with a driver circuit 10, a first sub-word line 11, bit lines 12, a second sub-word line 13, a coupling line 14, a through hole 15, a contact hole 16, a pre-charge circuit 90 and a memory cell 100. In the semiconductor memory, 8 memory cells are arrayed on one row. Its memory cell is connected to a pair of bit lines 12. The bit lines 12 are connected to the pre-charge circuit 90. The first sub-word line 11 is connected through the through hole 15 to the coupling line 14. The coupling line 14 is connected through the contact hole 16 to the second sub-word line 13. The first sub-word line 11 is connected to the driver circuit 10. The second sub-word line 13 is connected to a polysilicon gate electrode (not shown) of a MOS transistor of receiving a sub-word line drive signal.

The semiconductor memory is manufactured by a silicon gate MOS process. The semiconductor memory has a first wiring layer. The first wiring layer is a diffusion layer in which impurities at high concentration are implanted into crystalline silicon substrate. The semiconductor memory has a second wiring layer on the first wiring layer. This second wiring layer is a polysilicon layer in which polysilicon is used as wiring material. This wiring is used as a gate electrode of a MOS transistor. The semiconductor memory has a third wiring layer. This third wiring layer is an aluminum layer. The semiconductor memory has a fourth wiring layer. This fourth wiring layer is an aluminum layer.

The first sub-word line is formed in the fourth wiring layer. The second sub-word line 13 is formed in the second wiring layer. The coupling line 14 is formed in the third wiring layer. The through hole 15 is formed in an insulation layer between layers. The contact hole 16 is formed in an interlayer insulation layer.

An output signal of the driver circuit 10 is transmitted to the first sub-word line 11. A signal on the first sub-word line 11 is transmitted to the second sub-word line 13. A signal on the second sub-word line 13 is transmitted to a gate electrode (not shown) of a switching MOS transistor of the memory cell 100.

Figure 5:
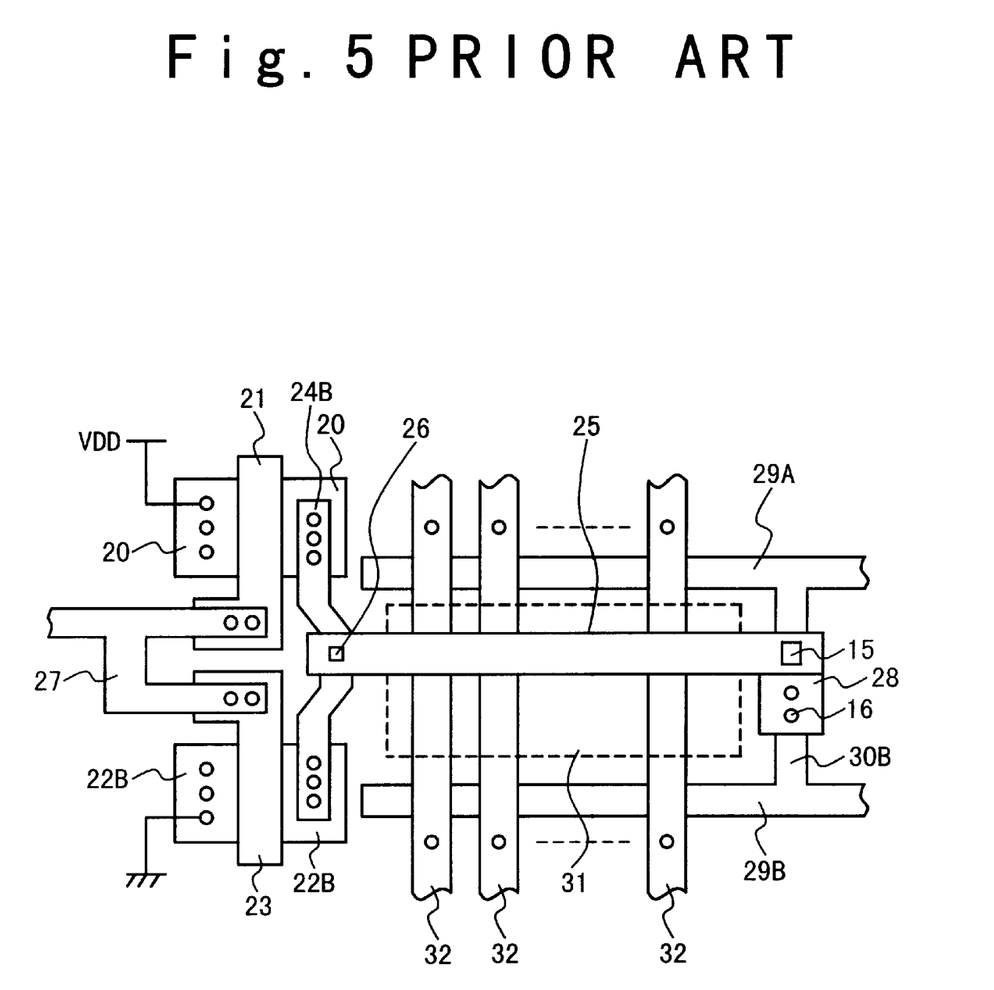
FIG. 5 shows a mask layout of a conventional semiconductor memory.

FIG. 5 shows a mask layout of a conventional semiconductor memory. The semiconductor memory shown in FIG. 5 has a memory cell section 31 and two second sub-word lines (polysilicon wiring) 29. The semiconductor memory has a polysilicon wiring 30. The semiconductor memory has a bit line (aluminum wiring) 32 and a first sub-word line (aluminum wiring) 25. The semiconductor memory has a coupling line (aluminum wiring) 28. The semiconductor memory has a through hole 15 and a contact hole 16. The semiconductor memory has a p+ diffusion area 20. The semiconductor memory has a polysilicon wiring 21. The semiconductor memory has an n+ diffusion area 22. The semiconductor memory has a polysilicon wiring 23.

The polysilicon wiring 21 is an output stage of a driver (the driver circuit 10 in FIG. 4) for driving the sub-word line. Its output stage is a gate electrode of a pMOS transistor. A left portion (in FIG. 5) of the p+ diffusion area 20 is a source area of the pMOS transistor. A right portion (in FIG. 5) of the p+ diffusion area 20 is a drain area.

The polysilicon wiring 21 is connected through an aluminum wiring 24 to a polysilicon wiring 23. The aluminum wiring 24 is connected through a contact hole 26 to the aluminum wiring 25. The polysilicon wiring 21 is connected through an aluminum wiring 27 to the polysilicon wiring 23. The aluminum wiring 25 is connected through the through hole 15 to the aluminum wiring 28. The aluminum wiring 28 is connected through the contact hole 16 to the polysilicon wiring 30.

A signal of driving the sub-word line is generated in the aluminum wiring 27. The sub-word line is at a potential of a high level (H) in a case of an active state. If the sub-word line is set active, the pMOS transistor of the driver circuit 10 is turned on. The nMOS transistor of the driver circuit 10 is turned off. The sub-word line is at a potential of a low level (L) in a case of an inactive state. If the sub-word line is set inactive, the pMOS transistor of the driver circuit 10 is turned off. The nMOS transistor of the driver circuit 10 is turned on.

The sub-word line and the bit line can not be formed in the same layer. The aluminum layer requires two layers. A wiring density of the bit line is higher than that of the sub-word line. The bit line is formed on a surface in which irregularity is small. A surface of a first aluminum layer is smoother than that of a second aluminum layer. The first aluminum layer is used for the formation of the bit line. The second aluminum layer is used for the formation of the sub-word line.

The trouble of the break of the first sub-word line 11 or the coupling line 14 is brought about in a semiconductor memory. The break is brought about if dust is mixed in a process of manufacturing a semiconductor memory. If the dust is mixed with the first sub-word line 11, the dust becomes the obstacle to the line and thereby causes the break to be brought about. If the dust is mixed with the coupling line 14, the break of the coupling line 14 is also brought about.

The break is brought about if the dust is positioned across the first sub-word line 11 and other wiring. This break is caused by a short-circuit current flowing through the dust. This short-circuit current causes the first sub-word line 11 to be melted and disconnected. The break is also brought about if the dust is positioned across the coupling line 14 and other wiring. This break is brought about if a width of the first sub-word line 11 is not uniform. A BT (Bias Temperature) stress is incurred in a portion where the width of the first sub-word line is narrow. This BT stress causes an electrical migration. This electrical migration causes the first sub-word line 11 to be disconnected. If there is a step difference in the aluminum layer where the first sub-word line 11 or the coupling line 14 is wired, the break is brought about in the portion of the step difference. The aluminum layer is poor in step difference coating performance. In the aluminum layer which is poor in the step difference coating performance, the wiring layer having the step difference is apt to be formed. If the step difference is present on the wiring route in the first sub-word line 11, it is disconnected at the portion of the step difference. The coupling line 14 is similarly disconnected.

The redundant sub-word line or the redundant coupling line is used instead of the disconnected first sub-word line 11 or coupling line 14. The memory cell is accessed by using the redundant sub-word line or the redundant coupling line.

The driver for driving the disconnected first sub-word line 11 or coupling line 14 is set off. An output signal of the driver is fixed at a low level (L). The disconnected portion disturbs the transmission of the output signal. A floating portion in which a potential is not stable is present on the first sub-word line 11 or the coupling line 14, even if the output signal of the driver is set at the low level (L). The potential of the floating portion becomes at a high level (h) if receiving an influence of an adjacent signal line. The potential of the floating portion becomes at the high level (h) if receiving an influence of a peripheral circuit. If the potential of the floating portion becomes at the high level (h), an access through the potential competes with an access through the redundant sub-word line and the redundant coupling line. This competition implies a multiple selection phenomenon.

The floating portion is formed in the conventional semiconductor integrated circuit, if the break is brought about on the sub-word line or the coupling line. This floating portion becomes active if receiving the influence of the peripheral wiring or the peripheral circuit. The access through the redundant sub-word line and the redundant coupling line and the access through the sub-word line and the coupling line compete with each other to accordingly incur the multiple selection phenomenon.

SUMMARY OF THE INVENTION

Therefore, an object of the present invention is to provide a semiconductor memory in which the multiple selection of a memory cells by a broken word line is not occurred.

In order to achieve an aspect of the present invention, a semiconductor memory according to the present invention is provided with a plurality of memory cells, a driver circuit, a first word line, a second word line, a third word line and a monitor circuit. The driver circuit drives the plurality of memory cells. The first word line is connected to the driver circuit. The second word line is mounted between the driver circuit and the memory cell. The third word line connects the first word line and the second word line. The monitor circuit detects a break of the first word line and the third word line. The second word line has a resistance higher than that of the first word line.

In order to achieve another aspect of the present invention, a semiconductor memory according to the present invention, is provided with a plurality of memory cells, a driver circuit, a first word line, a second word line, a third word line and a monitor circuit. The driver circuit drives the memory cells. The main word line is connected to the driver circuit. The first sub-word line is connected to the driver circuit. The second sub-word line is provided between the driver circuit and the memory cell. The third sub-word line connects the first sub-word line and the second sub-word line. The monitor circuit detects a break of the first sub-word line and the third word line. The second sub-word line has a resistance higher than that of the first sub-word line.

In the above, a second wiring layer of the second word line has a resistivity higher than that of a first wiring layer of the first word line.

In this case, the first wiring layer is made of aluminum and the second wiring layer is made of polysilicon.

Also, the driver circuit may have a p channel MOS-type field effect transistor, an n channel MOS-type field effect transistor and a coupling line for coupling a source of the p channel MOS-type field effect transistor and a source of the n channel MOS-type field effect transistor. The coupling line is connected to the first word line and the second word line.

Also, the monitor circuit outputs to the driver circuit an instruction of inhibiting access to the plurality of memory cells, when the monitor circuit detects a break of the first word line and the third word line.

Also, the memory cell may be of a static random access type, of a dynamic random access type or of a read only type.

In order to achieve an aspect of the present invention, a method of controlling a semiconductor memory comprising steps of monitoring a word line, monitoring a break on the word line; and inhibiting the word line by using a further word line. The first word line is connected to a driver circuit for a plurality of memory cells. The inhibiting is performed, when the break is detected.

Here, the second word line having a resistance higher than that of the first word line.

In order to achieve an aspect of the present invention, a semiconductor memory according to the invention comprising a monitoring circuit and a driver circuit.

The monitoring circuit detects a break of a first word line. The driver circuit inhibits the first word line using the second word line, when the monitoring circuit detects the break of the first word line. A resistance of the second word line higher than that of the first line.

DESCRIPTION OF THE PREFERRED EMBODIMENTS

Figure 6:
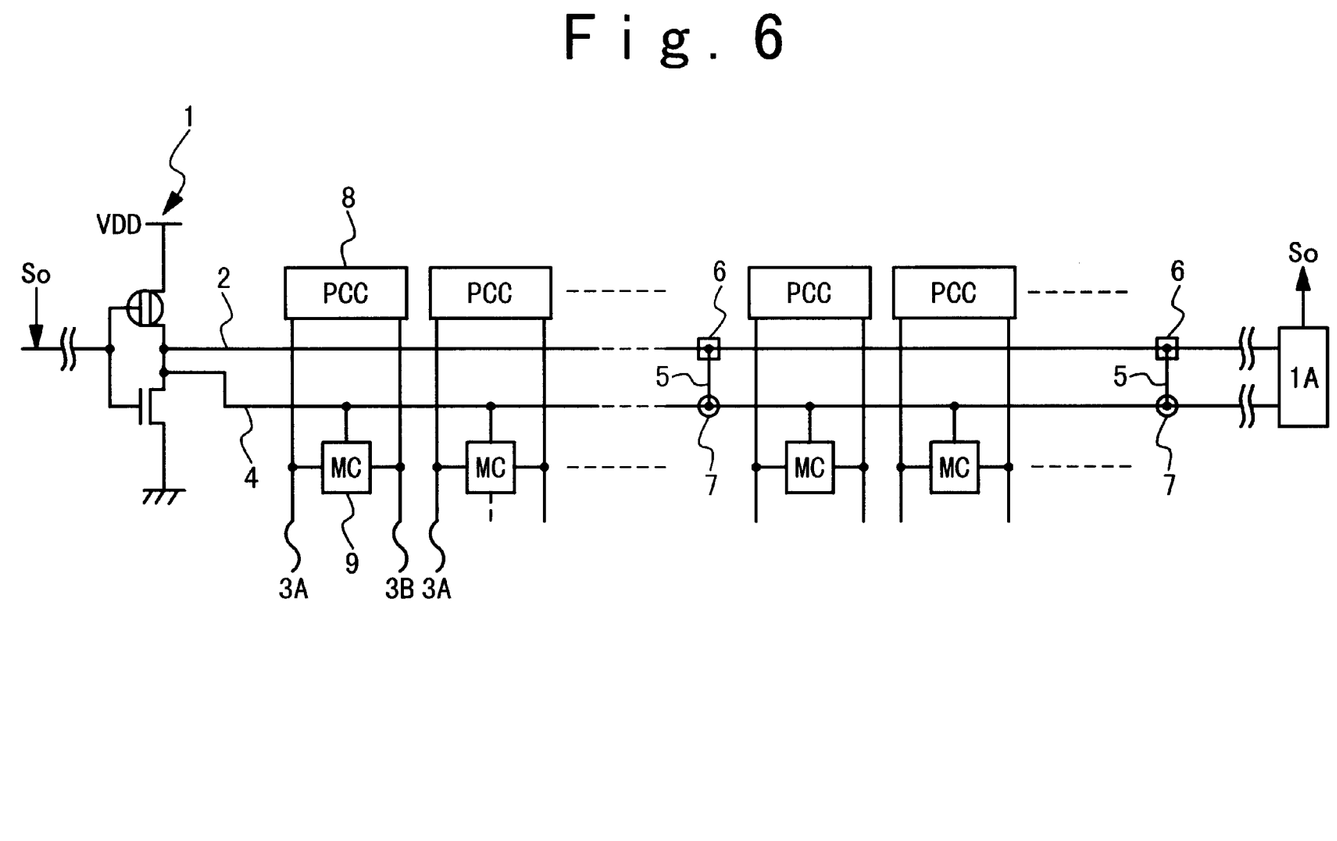
FIG. 6 shows a word suspension structure of a semiconductor memory according to the present invention.

FIG. 6 shows a word suspension structure of the semiconductor memory according to the present invention. The semiconductor memory shown in FIG. 6 is provided with a driver circuit 1, a monitor circuit 1A, a first sub-word line 2, bit lines 3A, 3B, a second sub-word line 4, a coupling line 5, a through hole 6, a contact hole 7, a pre-charge circuit 8 and a memory cell 9. The driver circuit 1 has a p channel MOS-type field effect transistor and an n channel MOS-type field effect transistor. In the semiconductor memory, 8 memory cells are arrayed on one row.

The memory cell is connected to a pair of bit lines 3A, 3B. The bit lines 3A, 3B are connected to the pre-charge circuit 8. The first sub-word line 2 is connected through the through hole 6 to the coupling line 5. The first sub-word line 2 is connected to the monitor circuit 1A. The coupling line 5 is connected through the contact hole 7 to the second sub-word line 4. The first sub-word line 2 is connected to an output section of the driver circuit 1. The second sub-word line 4 is connected to the output section of the driver circuit 1.

The semiconductor memory is manufactured by a silicon gate MOS process. The semiconductor memory has a first wiring layer. The first wiring layer is a diffusion layer in which impurities at high concentration are implanted into crystalline silicon substrate. The semiconductor memory has a second wiring layer on the first wiring layer. This second wiring layer is a polysilicon layer in which polysilicon is used as wiring material. This wiring is used as a gate electrode of a MOS transistor. The semiconductor memory has a third wiring layer. This third wiring layer is an aluminum layer. The semiconductor memory has a fourth wiring layer. This fourth wiring layer is an aluminum layer.

The first sub-word line 2 is formed in the fourth wiring layer. The second sub-word line 4 is formed in the second wiring layer. The coupling line 5 is formed in the third wiring layer. The through hole 6 is formed in an insulation layer between layers. The contact hole 7 is formed in an interlayer insulation layer.

The output section of the driver circuit 1 is a drain of the p channel MOS-type field effect transistor. An output signal of the drain is transmitted to the first sub-word line 2. A signal on the first sub-word line 2 is transmitted to the second sub-word line 4. A signal on the second sub-word line 4 is transmitted to a gate electrode (not shown) of a switching MOS transistor of the memory cell 9.

The monitor circuit 1A monitors a break of the first sub-word line 2 and the coupling line 5. The monitor circuit 1A, if detecting the break, transmits the detection signal S0 to the driver circuit 1. The driver circuit 1, when receiving a detection signal S0, sets the output signal at a low level. A potential of the second sub-word line 4 becomes at the low level, on the basis of the output signal. The memory cell 9 becomes inactive, on the basis of the potential of the second sub-word line 4.

Figure 7:
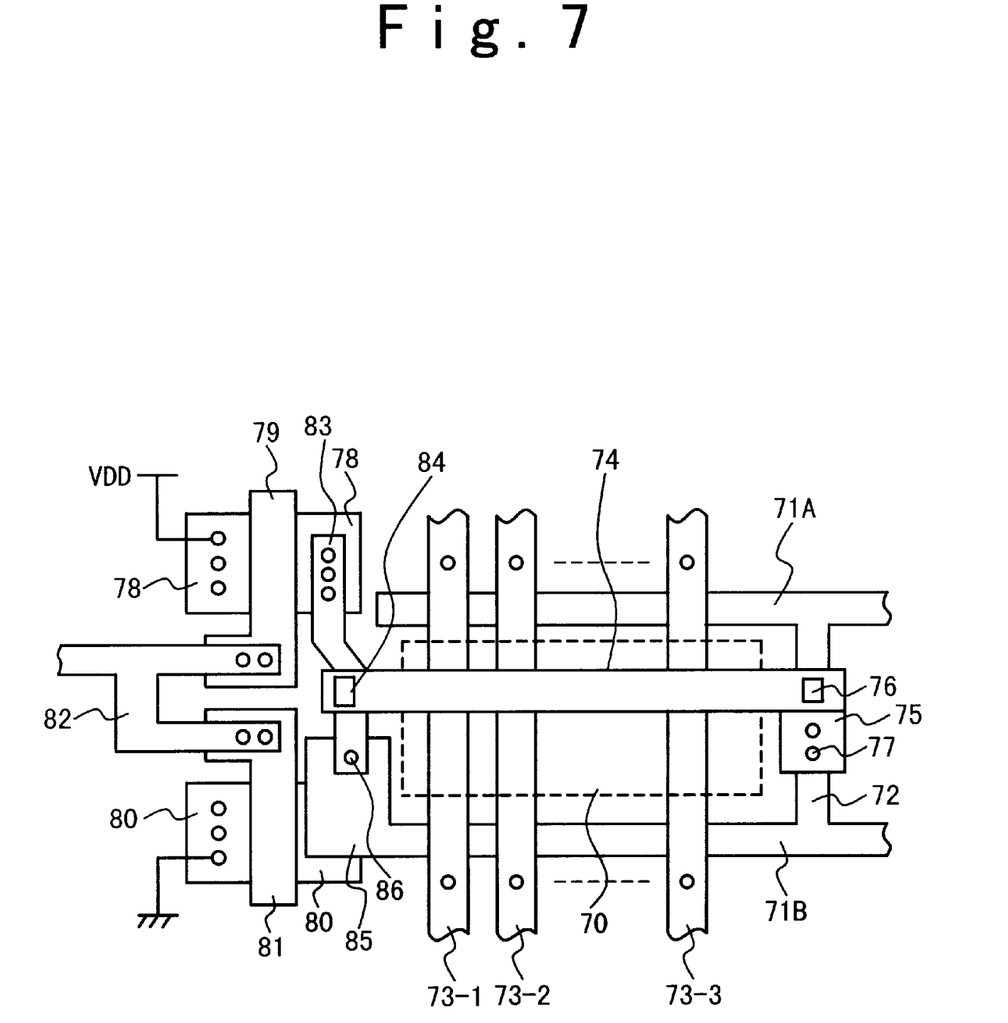
FIG. 7 shows a mask layout of the semiconductor memory according to the present invention.

FIG. 7 shows a mask layout of the semiconductor memory according to the present invention. The semiconductor memory shown in FIG. 7 has a memory cell section 70 and two second sub-word lines (Polysilicon wiring) 71A, 71B. The semiconductor memory has a polysilicon wiring 72. The semiconductor memory has bit lines (Aluminum wiring) 73-1, 73-2 and 73-3, and a first sub-word line (Aluminum wiring) 74. The semiconductor memory has a coupling line (Aluminum wiring) 75. The semiconductor memory has a through hole 76 and a contact hole 77. The semiconductor memory has a p+ diffusion area 78. The semiconductor memory has a polysilicon wiring 79. The semiconductor memory has an n+ diffusion area 80. The semiconductor memory has a polysilicon wiring 81. The semiconductor memory has an aluminum wiring 82. The semiconductor memory has an aluminum wiring 83. The semiconductor memory has a through hole 84. The semiconductor memory has a direct contact section 86 and a through hole 85.

The polysilicon wiring 79 is an output stage of a driver (the driver circuit 1 in FIG. 6) for driving the sub-word line. Its output stage is a gate electrode of a pMOS transistor. A left portion (in FIG. 7) of the p+ diffusion area 78 is a source area of the pMOS transistor. A right portion (in FIG. 7) of the p+ diffusion area 78 is a drain area.

The polysilicon wiring 79 is connected through the aluminum wiring 82 to the polysilicon wiring 81. The aluminum wiring 83 is connected through the through hole 84 to the aluminum wiring 74. The aluminum wiring 74 is connected through the through hole 76 to the aluminum wiring 75. The aluminum wiring 75 is connected through the contact hole 77 to the polysilicon wiring 72.

A signal of driving the sub-word line is generated in the aluminum wiring 82. The sub-word line is at a potential of a high level (H) in a case of an active state. If the sub-word line is set active, the pMOS transistor (diffusion area 78) of the driver circuit 1 is turned on. The nMOS transistor (diffusion area 80) of the driver circuit 1 is turned off. The sub-word line is at a potential of a low level (L) in a case of an inactive state. If the sub-word line is set inactive, the pMOS transistor (diffusion area 78) of the driver circuit 1 is turned off. The nMOS transistor (diffusion area 80) of the driver circuit 1 is turned on. The sub-word line 71B of the polysilicon layer is connected through the direct contact section 85 to the output section of the driver circuit 1. This connection type is referred to as [Direct Contact]. This drain electrode is the n+ diffusion area 80. The drain electrode (p+ diffusion area 80) of the pMOS transistor is connected through the aluminum wiring 83 and the through hole 86 to the direct contact section 86. This direct contact section 76 is connected to the drain electrode (n+ diffusion area 80) of the nMOS transistor. The direct contact section 86 is a part of the sub-word line 71B. The sub-word line 71B is connected to the drain electrode (n+ diffusion area 80) of the nMOS transistor.

The technique with regard to [Direct Contact] is disclosed in Japanese Patent Laid-Open JP-A-H07-029986 and JP-A-H06-209091.

The semiconductor memory according to this embodiment has the MOS transistors manufactured by using the silicon MOS process. The gate electrode and the polysilicon wiring in this MOS transistor are formed in the polysilicon wiring layer. The gate electrode is formed on a gate oxide film. The polysilicon wiring except the portion of the gate electrode, the drain electrode and the source electrode are connected to a region of a high impurity concentration, in a condition of low resistance. The condition of the low resistance is realized by selectively removing the gate oxide film on the region of the high impurity concentration and then making the polysilicon wiring and the region of the high impurity concentration in direct contact with each other.

The sub-word line and the bit line can not be formed in the same layer. The aluminum layer requires two layers. A wiring density of the bit line is higher than that of the sub-word line. The bit line is formed on a surface in which irregularity is small. A surface of a first aluminum layer is smoother than that of a second aluminum layer. The first aluminum layer is used for the formation of the bit line. The second aluminum layer is used for the formation of the sub-word line.

Referring to FIG. 6, the semiconductor memory according to the present invention can use the sub-word line 4 to access the memory cell, even if the sub-word line 2 or the coupling line 5 is disconnected. The sub-word line 2 is the aluminum wiring. The sub-word line 4 is the polysilicon wiring. The sub-word line 4 is very resistant to the break as compared with the sub-word line 2.

The sub-word line 4 is connected to the driver circuit 1, similarly to the sub-word line 2. The output signal of the driver circuit 1 is transmitted through the sub-word line 4 to the memory cell 9.

If the sub-word line 2 or the coupling line 5 is disconnected, the redundant word line and the redundant coupling line are made active. The driver circuit 1 sets the output signal at the low level (L). If the output signal is set at the low level (L), the potentials of the sub-word lines 2, 4 and the coupling line 5 become at the low level (L). The potential of the low level (L) is applied through the sub-word line 4 to the memory cell 9. In the memory cell 9, the operational state thereof is determined on the basis of the potential of the sub-word line 4, without receiving the influence of the sub-word line 2 or the coupling line 5. The control through the redundant sub-word line and the redundant coupling line does not compete with the control through the sub-word line 4 and the coupling line 5. The multiple selection of the memory cell is not incurred.

The semiconductor memory according to the present invention has the main word lines in which the word lines are formed on the hierarchical structure and the sub-word lines. Another semiconductor memory according to the present invention has the main word lines in which the word lines are formed on a single hierarchy and the sub-word lines.

In another semiconductor memory according to the present invention, the type thereof is a DRAM (Dynamic Random Access Memory) type.

In still another semiconductor memory according to the present invention, the type thereof is a ROM (Read Only Memory) type.

In the semiconductor memory according to the present invention, if a word line is disconnected, the word line can be surely set inactive. In the semiconductor memory according to the present invention, the access of the normal word line and the redundant word line do not compete with each other. In the semiconductor memory according to the present invention, the multiple selection situation is not incurred.

What is claimed is:

1. A semiconductor memory comprising:
   a plurality of memory cells in a memory cell array, said memory cell array including:
   a driver circuit driving said plurality of memory cells;
   a first word line connected to said driver circuit;
   a second word line arranged between said driver circuit and said memory cells of said memory cell array;
   a third word line connecting said first word line and said second word line; and
   a monitor circuit monitoring a break of said first word line and said third word line,
   wherein said second word line has a resistance higher than that of said first word line.

2. A semiconductor memory according to claim 1, wherein said semiconductor memory includes a first wiring layer and a second layer, said second word line is provided in said second wiring layer, said second wiring layer has a resistivity higher than that of said first wiring layer, and said first word line is provided in said first wiring layer.

3. A semiconductor memory according to claim 2, wherein said first wiring layer is made of aluminum, and said second wiring layer is made of polysilicon.

4. A semiconductor memory according to claim 1, wherein said driver circuit comprises;
   a p channel MOS-type field effect transistor;
   an n channel MOS-type field effect transistor; and
   a coupling line coupling a source of said p channel MOS-type field effect transistor and a source of said n channel MOS-type field effect transistor to each other, and
   wherein said coupling line is connected to said first word line and said second word line.

5. A semiconductor memory according to claim 1, wherein said monitor circuit outputs to said driver circuit, an instruction for inhibiting access to said memory cell array, when said monitor circuit detects said break.

6. A semiconductor memory according to claim 1, wherein said memory cell is of a static random access type.

7. A semiconductor memory according to claim 1, wherein said memory cell is of a dynamic random access type.

8. A semiconductor memory according to claim 1, wherein said memory cell is of a read only type.

9. A semiconductor memory comprising:
   a plurality of memory cells in a plurality of memory cell arrays, each memory cell array arranged in a matrix and including:
   a driver circuit driving said plurality of memory cells;
   a first word line connected to said driver circuit;
   a second word line provided between said driver circuit and said memory cells of said memory array;
   a third word line connecting said first word line and said second word line; and
   a monitor circuit monitoring a break of said first word line and said third word line,
   wherein said second word line has a resistance higher than that of said first word line.

10. A semiconductor memory according to claim 9, wherein said semiconductor memory includes a first wiring layer and a second layer, said second word line is provided in said second wiring layer, said second wiring layer has a resistivity higher than that of said first wiring layer, and said first word line is provided in said first wiring layer.

11. A semiconductor memory according to claim 9, wherein said first wiring layer is made of Aluminum, and said second wiring layer is made of polysilicon.

12. A semiconductor memory according to claim 9, wherein said driver circuit comprises;
    a p channel MOS-type field effect transistor;
    an n channel MOS-type field effect transistor; and
    a coupling line coupling a source of said p channel MOS-type field effect transistor and a source of said n channel MOS-type field effect transistor to each other, and
    wherein said coupling line is connected to said second word line.

13. A semiconductor memory according to claim 9, wherein said monitor circuit, if said break is detected, outputs an instruction making access of said memory cell array ineffective for said driver circuit.

14. A semiconductor memory according to claim 9, wherein a type of said memory cell is a static random access type.

15. A semiconductor memory according to claim 9, wherein a type of said memory cell is a dynamic random access type.

16. A semiconductor memory according to claim 9, wherein a type of said memory cell is a read only type.

17. A method of controlling a semiconductor memory, comprising the steps of:
    monitoring a break on a first word line which is connected to a driver circuit for a memory cell array; and inhibiting access to said first word line using a second word line, when the break is detected.

18. A method of controlling a semiconductor memory according to claim 17, wherein said second word line has a resistance higher than that of said first word line.

19. A semiconductor memory comprising:

a monitoring circuit for monitoring a break of a first word line; and a driver circuit inhibits access to said first line using a second word line, when the monitoring circuit detects said break;

wherein a resistance of said second word line is higher than that of said first word line.

* * * * *